United States Patent [19]
Desbonnets

[11] Patent Number: 6,052,015
[45] Date of Patent: Apr. 18, 2000

[54] OUTPUT STAGE FOR A LOW-CURRENT CHARGE PUMP AND DEMODULATOR INTEGRATING SUCH A PUMP

[75] Inventor: Eric Desbonnets, Caen, France

[73] Assignee: U.S. Philips Corporation, New York, N.Y.

[21] Appl. No.: 09/112,607

[22] Filed: Jul. 9, 1998

[30] Foreign Application Priority Data

Aug. 27, 1997 [FR] France ................................. 97 10687

[51] Int. Cl.[7] ................................................ H03K 17/00
[52] U.S. Cl. ........................................ 327/382; 327/434
[58] Field of Search .............................. 327/147, 148, 327/156, 157, 382, 384, 434, 427; 331/DIG. 2, 17

[56] References Cited

U.S. PATENT DOCUMENTS

| | | | |
|---|---|---|---|
| 4,689,581 | 8/1987 | Talbot | 331/1 A |
| 5,144,156 | 9/1992 | Kawasaki | 327/157 |
| 5,473,283 | 12/1995 | Luich | 327/157 |
| 5,646,563 | 7/1997 | Kuo | 327/157 |
| 5,699,020 | 12/1997 | Jefferson | 331/DIG. 2 |
| 5,886,551 | 3/1999 | Narahara | 327/157 |

FOREIGN PATENT DOCUMENTS

0398254B1  11/1990  European Pat. Off. .

*Primary Examiner*—Jung Ho Kim
*Attorney, Agent, or Firm*—Dicran Halajian

[57] ABSTRACT

The present invention discloses an output stage for a charge pump, mainly formed by transistors, for example, MOS-type transistors. This output stage includes capacitive elements intended to compensate charge/discharge phenomena of parasitic capacitances intrinsic to the transistors. A charge pump including such a stage may thus produce a low-value nominal current and enables to completely integrate a phase-locked loop demodulator.

7 Claims, 3 Drawing Sheets

OUTPUT STAGE FOR A LOW-CURRENT CHARGE PUMP AND DEMODULATOR INTEGRATING SUCH A PUMP

FIELD OF THE INVENTION

The present invention relates to an output stage for a circuit of the charge pump type, having a control input intended to receive a control signal, and an output, the stage comprising a current mirror having an input terminal an output terminal and a reference terminal, the mirror current comprising an input transistor and an output transistor, each transistor having a terminal called bias terminal, a terminal called reference terminal and a terminal called transfer terminal, the reference terminals being interconnected and forming the reference terminal of the current mirror, the bias terminals together being connected to the transfer terminal of the input transistor, the transfer terminals of the input and output transistors forming the input and output terminals, respectively, of the current mirror, the junction between the reference terminal and the transfer terminal of a transistor defining its main current path, the input terminal of the current mirror being connected to a current source, the reference terminal of the current mirror being connected to a supply terminal, the output terminal of the current mirror being connected to the output of the stage via a switch which has a control input that forms the control input of the stage.

BACKGROUND OF THE INVENTION

Such an output stage is currently used in charge pumps intended to control oscillators, notably in phase-locked loop demodulators. Such a demodulator, known, for example, from European patent no. 0 398 254 B1, has a signal input intended to receive a frequency-modulated signal and an output intended to supply a demodulated signal. This demodulator conventionally comprises a phase detector intended to evaluate a phase shift that exists between a signal present on the output of an oscillator and the modulated input signal, and to supply to a charge pump control signals which represent said phase difference. The charge pump is intended to supply a current on an output connected to a loop filter during time intervals defined by the control signals. The voltage present on the terminals of the loop filter which is formed by a resistive element connected in series with a capacitive element constitutes an adjusting voltage which determines the frequency of the output signal of the oscillator, said voltage further constituting the demodulated signal.

These demodulators are often used in the field of video signal reception where the modulated signals have a frequency of the order of a hundred megahertz, which makes it possible to use, for the loop filter, a capacitor which may be easily realized in an integrated circuit containing the whole demodulator. Indeed, one of the functions of the loop filter is to supply on its terminals a variable voltage component having a frequency that is considerably lower than the frequency of the modulated signal, which component is then equivalent to a DC component of said signal. If the frequency of the modulated signal has a large value, as is the case in video signals, the time constant of the loop filter defined as being the product of the values of the resistive and capacitive elements may be chosen to be relatively low, which permits the use of a capacitor having a value lower than several picofarads.

A phase-locked loop demodulator may be used in a radio telephone but in that case the frequency of the modulated signal is much lower, for example, of the order of a hundred kilohertz for architectures of the conventional double heterodyne type, used, for example, in devices satisfying the AMPS or CT0 standards. This leads to the necessity of using a capacitor of a much higher value for the loop filter. In the state of the art it is not possible to implement in integrated form inexpensive capacitors of more than several hundred picofarads. However, it is desirable to implement the whole demodulator in integrated form. Indeed, any external component is costly by itself, calls forth the addition of extra pins on the housing containing the rest of the demodulator and gives rise to an additional assembly step during the manufacture of the radio telephone, during which the external component is to be connected to the integrated circuit. In addition, the reduction of the bulkiness of the elements forming the radio telephone makes it possible to reduce the size and the weight of this radio telephone, which offers an advantage for its user and thus forms an unavoidable necessity.

The value of the capacitor used for the loop filter depends on various parameters, among which the stability and the gain of the circuit assembly formed by the demodulator, as well as the value of a current called output current produced by the charge pump. Thus, it is possible to use a capacitor having a value of ten picofarads if the output current of the charge pump has a nominal value lower than 10 microamperes.

In the state of the art, the charge pumps are mostly used for supplying output currents which have a nominal value of the order of one milliampere. The low nominal value required in the present case, so as to enable a complete integration of the demodulator is the cause of additional problems. Indeed, the transistors forming the output stage of the charge pump have intrinsic parasitic capacitances. When the switch switches, these capacitances are charged or discharged and thus generate, on the output of the charge pump, parasitic currents which have an amplitude which is 10 to 100 times higher than the nominal value of the output current of the charge pump. These charge/discharge phenomena of the parasitic capacitances will thus considerably disturb the operation of the demodulator.

It is an object of the present invention to enable the implementation in a completely integrated form of a phase-locked loop demodulator for radio telephony applications, by proposing an output stage for a charge pump in which the influence of the charge/discharge phenomena of the parasitic capacitors on the output current of the charge pump is minimized.

SUMMARY OF THE INVENTION

Indeed, according to the present invention, an output stage as defined in the opening paragraph is characterized in that it comprises a compensating capacitive element which has a first terminal called connection terminal connected to a junction between the output terminal of the current mirror and the stage output, and a terminal called bias terminal intended to receive a signal which is in phase with the control signal.

The output stage according to the invention may be used either for establishing the conduction of a current towards the stage's output, or for causing an inrush current from the stage's output, depending on the configuration in which said stage is used. If the reference terminal of the current mirror is connected to a positive supply terminal, the parasitic capacitance of the output transistor of the current mirror is charged until the switch switches, in order to establish the conduction of a nominal current towards the stage's output.

When the switch becomes conductive, the parasitic capacitance is discharged through the compensating capacitive element which causes a flow of electric charges to the bias terminal of this compensating element and no longer to the stage output as this would have been the case if said compensating element were absent. Conversely, if the reference terminal of the current mirror is connected to a negative supply terminal, for example, the ground terminal of the circuit, the parasitic capacitance of the output transistor of the current mirror will charge when the switch is rendered conductive in order to cause an inrush current from the stage output. The electric charges necessary for charging the parasitic capacitance are no longer derived from the output of the stage as this would have been the case if there were no compensating capacitive element, but from the bias terminal of said compensating element. The effects of the charge/discharge phenomena of the parasitic capacitances on the output current are thus considerably reduced.

The switch itself may also cause disturbing phenomena to occur. Indeed, this switch is realized in the form of a transistor, then called switch transistor, which also has intrinsic parasitic capacitances. The switching of the switch thus may generate parasitic currents having a large amplitude on the output of the stage. A variant of the invention thus provides an output stage for a circuit of the charge pump type characterized in that, whereas the switch is formed by a transistor whose bias terminal forms the control input and whose main current path is arranged between the output terminal of the current mirror and the output of the stage, this stage includes a further compensating capacitive element which has a connection terminal connected to a junction between the output terminal of the current mirror and the output of the stage, and a bias terminal intended to receive a signal in phase opposition to the control signal.

In such an output stage, the compensating capacitive element associated to the switch transistor receives on its bias terminal a voltage which is the opposite to that under the influence of which electric charges flow through the parasitic capacitance of the switch transistor. The compensating capacitive element is thus subjected to a charge transfer which is identical to that which occurs in the parasitic capacitance of the switch transistor, but in opposite direction. In theory, the two transfers of charges are compensated perfectly if the value of the parasitic capacitance of the switch transistor and that of its compensating capacitive element are identical. Thus, the charges no longer flow through the output of the stage, but, via the compensating element, through the bias terminal of the latter. The output of the stage thus no longer carries the charges necessary for the charge/discharge phenomena of the parasitic capacitance of the switch transistor.

In a particularly advantageous embodiment of the invention each compensating capacitive element is formed by a transistor called compensating transistor whose reference terminal and transfer terminal are connected to each other and thus form the connection terminal of the compensating capacitive element, the bias terminal of the compensating transistor forming the bias terminal of the compensating capacitive element.

This embodiment makes it possible to provide an optimum pairing between the parasitic capacitances of the transistors and their associated compensating capacitive elements. Indeed, the latter are thus also formed by intrinsic parasitic capacitances which have values similar to those which cause the disturbing charge/discharge phenomena, all the transistors being obtained by means of the same manufacturing process. This pairing, which further provides the advantage that it is very simple to obtain, permits a good compensation of said disturbing phenomena.

Two complementary output stages may advantageously be used for realizing a charge pump. The invention thus also relates to a charge pump having a first and a second control input intended for receiving a first and a second control signal respectively, and an output, characterized in that the charge pump comprises a first and a second output stage, both being in conformity with the previous description, connected in series between a first and a second supply terminal, and which outputs are interconnected and form the output of the charge pump, the first output stage being formed by transistors having a conductivity type contrary to those forming the second output stage, the control inputs of the first and second output stages forming the first and second control inputs respectively, of the charge pump, the reference terminals of the current mirrors of the first and second output stages being connected to the first and second supply terminals, respectively.

Such a complementary structure makes it possible to control a charge or discharge of the capacitance of the loop filter, one stage being intended to provide the charging by establishing the conduction of the nominal current towards the output of the charge pump, the other to provide the discharging by causing an inrush current having the same value to flow from the output of the charge pump.

As defined previously, a charge pump according to the invention is particularly well adapted to applications in integrated modulators. The invention thus also relates to a demodulator as defined in claim 5.

Finally, the invention which permits the complete integration of a radio signal demodulator may advantageously be used in a portable radio telephony device. The invention thus also relates to a radio telephony device as defined in claim 6.

BRIEF DESCRIPTION OF THE DRAWINGS

These and other aspects of the invention will be apparent from and elucidated with reference to the embodiments described hereinafter.

In the drawings.

DESCRIPTION OF PREFERRED EMBODIMENTS

Figure 1:
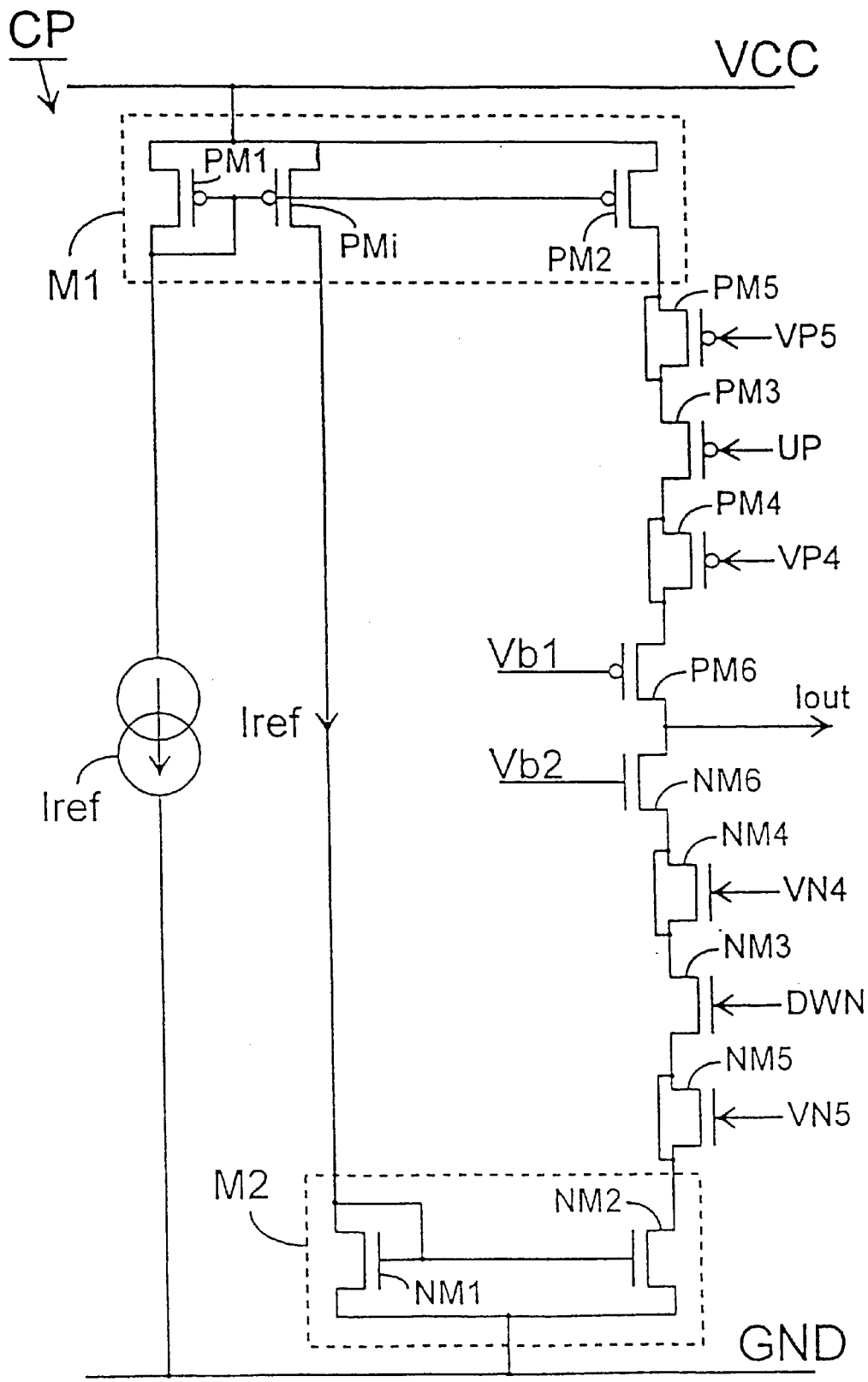
FIG. 1 is an electric circuit diagram describing a charge pump according to an advantageous embodiment of the invention.

FIG. 1 represents a charge pump CP according to a particularly advantageous embodiment of the invention. This charge pump CP has a first and a second control input intended to receive a first and a second control signal UP and DWN respectively, and an output intended to supply a current Iout. This charge pump includes a first and a second output stage connected in series between a first and a second supply terminal VCC and GND. The first output stage is formed by transistors of the PMOS type, the second output stage is formed by transistors of the NMOS type. The first and second output stages have control inputs intended to receive control signals UP or DWN respectively, and outputs connected to the output of the charge pump CP. The first and second output stages include a first and a second current mirror M1 and M2, respectively, each having an input terminal, an output terminal and a reference terminal. Each current mirror M1 or M2 comprises an input transistor PM1 or NM1 and an output transistor PM2 or NM2. Each transistor is here of the MOS type and has one terminal called bias terminal formed in this case by the gate of the transistor, one terminal called reference terminal formed by the source of the transistor, and one terminal called transfer terminal formed by the drain of the transistor. The sources of the transistor pairs PM1, PM2 and NM1, NM2 are connected to each other and form the reference terminals of the first and second current mirrors M1 and M2, respectively. The gates of the transistors PM1 and PM2 and those of the transistors NM1, NM2 are together connected to the drains of the transistors PM1, NM1, respectively. The drains of the input transistors PM1, NM1 and output transistors PM2, NM2 form the input terminals and output terminals of the first and second current mirrors, respectively. The junction between the source and drain of a transistor defines its main current path. The input terminal of the first current mirror M1 is connected to a current source which supplies a reference current whose nominal value is Iref. The first current mirror comprises an intermediate PMOS transistor PMi connected in parallel with the output transistor PM2 which copies said reference current Iref. The input terminal of the second current mirror M2 is connected to the drain of this intermediate transistor PMi and thus receives a current whose nominal value is also Iref. For permitting a better copying of the current, cascode-type structures, which are well-known to any person skilled in the art, may be introduced between the current mirrors described above and the current source. The reference terminals of the first and second current mirrors M1 and M2 are connected to the first and second supply terminals VCC and GND, respectively. The output terminals of the first and second current mirrors M1 and M2 are connected to the outputs of the first and second stages respectively, via switches formed by MOS type transistors PM3 and NM3 respectively, whose gates form the control inputs of the first and second stages, and whose main current paths are respectively arranged between the output terminals of the first and second current mirrors M1 and M2 and the output of the charge pump CP. The first and second output stages comprise a first transistor called compensating transistor PM4 of the PMOS type and a second compensating transistor NM4 of the NMOS type, respectively, each having its source and drain connected together and thus forming a terminal called connection terminal of the compensating transistor PM4 or NM4, whose gate forms a bias terminal. The connection terminals of the first and second compensating transistors PM4 and NM4 are connected to the drains of the switch transistors PM3 and NM3, respectively, whereas their bias terminals are intended to receive signals VP4 and VN4 which are in phase with the first and second control signals UP and DWN, respectively. The first and second output stages comprise a third compensating transistor PM5 of the PMOS type and a fourth compensating transistor NM5 of the NMOS type, respectively, each having its source and drain connected to each other and thus forming a terminal called connection terminal of the compensating transistor PM5 or NM5, whose gate forms a bias terminal. The connection terminals of the third and fourth compensating transistors PM5 and NM5 are connected to the drains of the output transistors of the first and second current mirrors respectively, whereas the bias terminals are intended to receive signals VP5 and VN5 which are in phase opposition to the first and second control signals UP and DWN, respectively. The first and second output stages comprise in this embodiment a first and a second isolation transistor PM6 and NM6 respectively, whose function is to ensure a symmetry in each of the output stages but also to isolate the output of the charge pump CP with respect to switch transistors PM3 and NM3 so that the electric charges do not flow directly from the switch transistors to the output of the charge pump CP during the switching operations of the switch transistors PM3 and NM3. These isolation transistors PM6 and NM6 will advantageously be the last elements of structures called "cascoded current mirrors with Vt compensation", well-known to any person skilled in the art and not shown in the Figure, which enable to obtain a maximum voltage range on the output of the charge pump CP. The first and second isolation transistors PM6 and NM6 receive on their respective gates voltages Vb1 and Vb2 which are sufficient for them to be turned on. The order in which the compensating transistors and the switch transistors are arranged in the example described here is arbitrary and has no effect on the operation of the charge pump CP.

Figure 2:
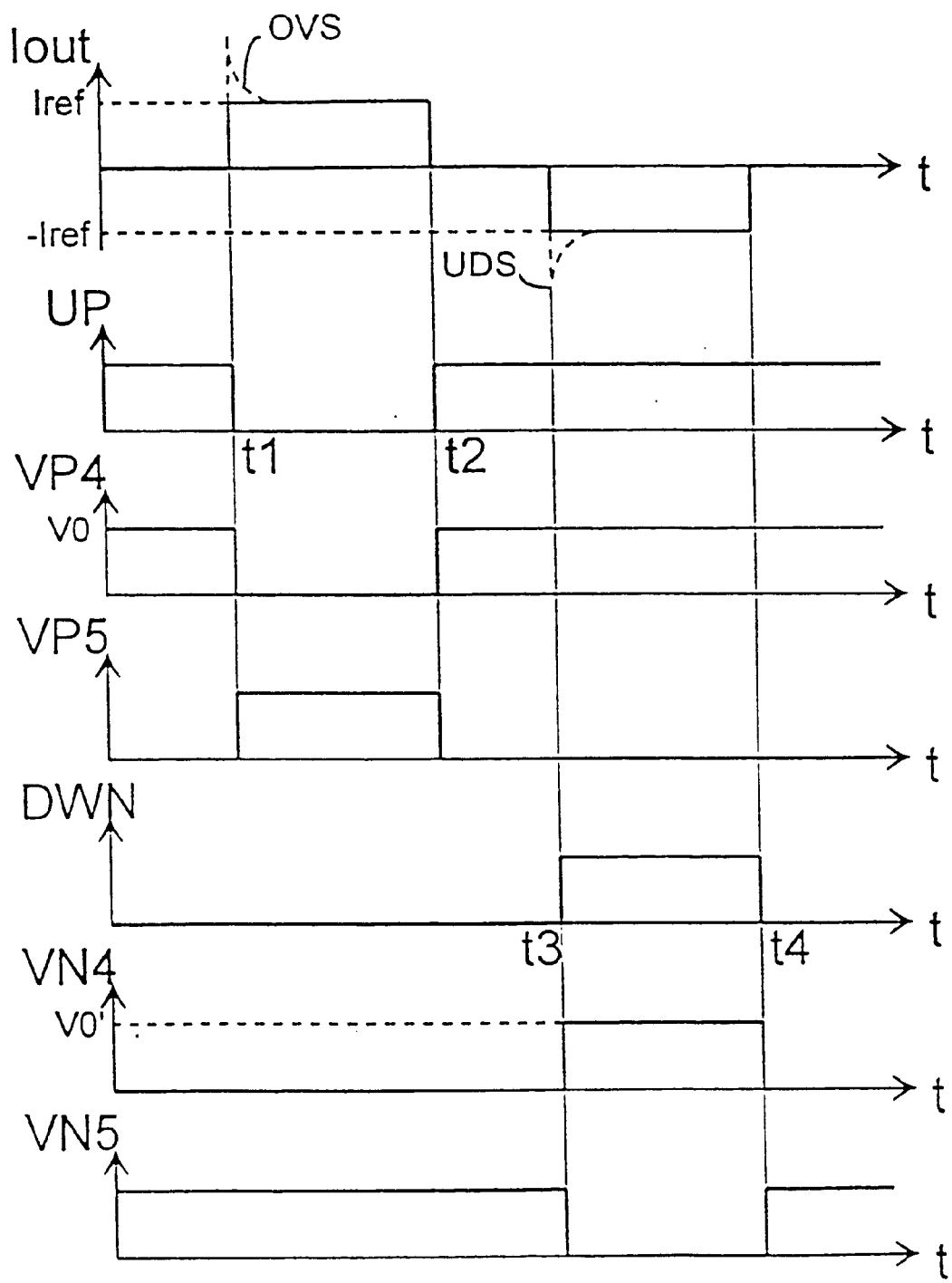
FIG. 2 is an assembly of timing diagrams describing the evolution of signals present in such a charge pump.

FIG. 2 is a set of timing diagrams describing the evolution of control signals driving the charge pump CP described above. At an instant t1, the signal UP features a falling edge for commanding the conduction of the PMOS switch transistor PM3. The output current Iout of the charge pump CP thus switches from a near-zero value to a positive nominal value denoted Iref. Simultaneously, the signal VP4 switches from a predefined potential V0 to a near-zero potential so as to command the injection of charges into the capacitance formed by the first comnpensating transistor PM4, whereas the signal VP5 has a rising edge for commanding the injection into the capacitance formed by the third compensating transistor PM5. At an instant t2, the signal UP features a rising edge for commanding the switching-off of the conduction of the PMOS switch transistor PM3. The output current Iout of the charge pump CP thus switches from its positive nominal value Iref to a near-zero value. At the same time, the signal VP4 switches from a near-zero potential to the predefined potential V0 whereas the signal VP5 features a falling edge. At an instant t3, the signal DWN shows a rising edge for commanding the conduction of the NMOS switch transistor NM3. The output current Iout of the charge pump CP thus switches from a near-zero zero value to a negative nominal value denoted -Iref. Simultaneously, the signal VN4 switches from a near-zero potential to a predefined potential V0' for commanding an injection of charges into the capacitance formed by the second compensating transistor NM4, whereas the signal VN5 features a falling edge for commanding an injection of charges into the capacitance formed by the fourth compensating transistor NM5. At an instant t4, the signal DWN features a falling edge for commanding the switching-off of the conduction of the NMOS switch transistor NM3. The output current Iout of the charge pump CP thus switches from its negative nominal value -Iref to a near-zero value. At the same time, the signal VN4 switches from the predefined potential V0' to a near-zero potential whereas the signal VN5 features a rising edge. The irregularities OVS and UDS represent, in a reduced form the influence which the charge/discharge phenomena of the parasitic capacitances would have on the output current Iout of the charge pump CP if there were no compensating transistors. The output transistor PM2 of the first current mirror M1 has a parasitic capacitance which is charged when the PMOS switch transistor PM3 is cut off, that is to say, before instant t1. The switching which occurs at t1 would cause the discharging of this capacitance and thus a move of electric charges towards the output of the charge pump CP if there were no first compensating transistor PM4. This discharge generates a parasitic current id1 because it is subjected to the law id1=$C.\Delta V/\Delta t$, where C is several hundred fentofarads, the variation $\Delta V$ of the potential of any intermediate junction of the first output stage being several hundred millivolts, whereas the switching time $\Delta t$ is of the order of one nanosecond. The parasitic current id1 thus generated, visible with an attenuation factor of the order of 100 in the form of a first overshoot OVS thus has as a peak of several hundred microamperes which would be added to the positive nominal value Iref. The first compensating transistor PM4 enables to evacuate electric charges coming from the discharging of the parasitic capacitance of the output transistor PM2 of the first current mirror M1 elsewhere than towards the output of the charge pump CP. The output transistor NM2 of the second current mirror M2 has a parasitic capacitance which is essentially discharged when the NMOS switch transistor NM3 is cut off, that is to say, before instant t3. The switching which takes place at t3 causes this capacitance to be charged, which would result in an injection of electric charges from the output of the charge pump CP if there were no first compensating transistor NM4. This charge generates a parasitic current id2 of the same order of magnitude as the parasitic current id1 described above. This parasitic current id2, visible in the form of an undershoot UDS at t3 thus has a peak of several hundred microamperes which would be subtracted from the negative nominal value -Iref of the output current Iout. The second compensating transistor NM4 enables to inject charges necessary for charging the parasitic capacitance of the output transistor NM2 of the second current mirror M2 from a terminal other than the output of the charge pump CP.

Additional charge/discharge phenomena notably caused by the switching of the switch transistors which will be described in the following of the description are superposed on the phenomena described above.

Figure 3:
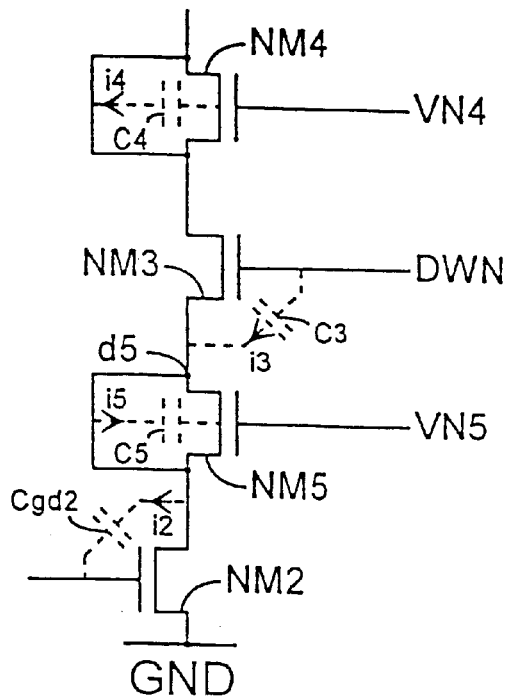
FIG. 3 is an electric circuit diagram describing more precisely an output stage according to the invention.

FIG. 3 describes more precisely the second output stage of the charge pump CP, in order to enable a better understanding of the operation of the compensation of the charge/discharge phenomena of the parasitic capacitances. The output transistor NM2 of the second current mirror M2 has a parasitic gate-drain capacitance denoted Cgd2. The second switch transistor NM3, the second compensating transistor NM4 and the fourth compensating transistor NM5 have parasitic capacitances denoted C3, C4 and C5, respectively, which are equivalent to their gate-source and gate-drain parasitic capacitances connected in parallel. These equivalent parasitic capacitances C3, C4 and C5 are represented in broken lines in the Figure. Before instant t3, capacitance Cgd2 is discharged. The fact that the switch transistor NM3 starts conducting at instant t3 causes a variation to occur in the potentials of the junctions of the second output stage. The potential Vd5 of the drain of the transistor NM5 is arbitrarily chosen to explain the following of the description. As the capacitance Cgd2 is subjected to a potential variation $\Delta$Vd5 for a period of time $\Delta t$, it is charged by a current i2=Cgd2.$\Delta$Vd5/$\Delta$t. At the same time, the capacitance C4 is subjected to a potential variation $\Delta V$=V0' for a period of time $\Delta t$ and is charged by a current i4=Cgs4.V0'/$\Delta t$. Thus, by choosing C4.V0'=Cgd2.$\Delta$Vd5, the current i2 necessary for charging the parasitic capacitance of the output transistor NM2 of the second current mirror M2 is perfectly compensated by the current i4 and the charge of Cgd2 causes no disturbing effect on the output current Iout of the charge pump CP. If, as is the case in FIG. 1, the second output stage comprises an isolation transistor NM6, the parasitic gate-source capacitance denoted Cgs6 of the latter is to be taken into account, which will generate an additional current equal to Cgs6.$\Delta$Vd5/$\Delta t$. The resulting choice will thus be C4.V0'= C(Cgd2+Cgs6).$\Delta$Vd5, in order to obtain a compensation of the currents generated by the parasitic capacitances of the transistors NM2 and NM6.

The switching of the second switch transistor NM3 causes a parasitic current i3 to flow through its equivalent parasitic capacitance C3, the gate of the transistor NM3 being subjected to a positive potential. The fourth compensating transistor NM5 enables the compensation of this current. Indeed, it is identical to the switch transistor NM3, and thus has an equivalent parasitic capacitance C5 whose value is very close to the equivalent parasitic capacitance C3 of the switch transistor NM3. The gate of the compensating transistor NM5 being put to a potential equal to the opposite of the potential of the gate of the switch transistor NM3, the capacitance C5 is flown through by a current i5 which is substantially equal to the parasitic current i3. It may thus be stated that the charges injected into the second stage during the switching of the switch transistor NM3 are immediately diverted to outside the stage by the compensating transistor NM5 and have no effect on the output current Iout of the charge pump CP.

The description of the operation of the second output stage which has been made above may easily be transposed to the first output stage.

Figure 4:
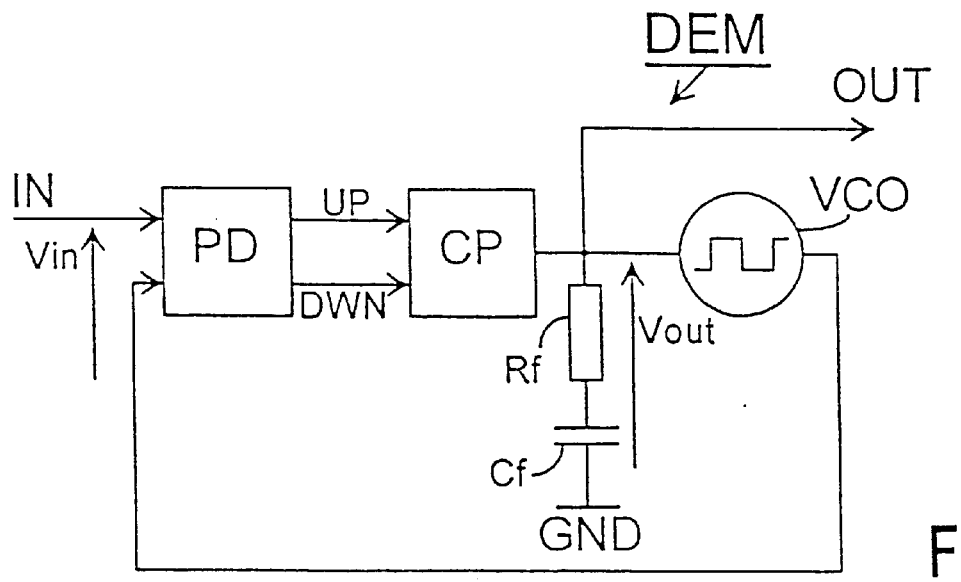
FIG. 4 is a function diagram describing a demodulator integrating a charge pump according to the invention.

FIG. 4 is a function diagram describing a demodulator DEM integrating the charge pump CP according to the invention. This is a phase-locked loop demodulator having a signal input intended to receive a frequency-modulated signal Vin and an output intended to supply a demodulated signal Vout, which comprises:

a phase detector PD intended to evaluate a phase difference existing between signals received on a first and a second signal input, and to supply, on a first and a second control output, signals UP and DWN representing said phase difference, the first signal input forming the signal input of the demodulator DEM, a charge pump CP in accordance with the previous description, having a first and a second control input connected to the first and the second control output respectively, of the phase detector PD, and an output connected to a loop filter formed by a resistive element Rf connected in series with a capacitive element Cf, and a voltage-controlled oscillator VCO with a tuning input, forming the output of the demodulator DEM, connected to the output of the charge pump CP and intended to receive a voltage Vout present on the terminals of the loop filter, and an output intended to supply a signal whose frequency depends on the value of the voltage received on the tuning input, said output being connected to the second signal input of the phase detector PD.

Figure 5:
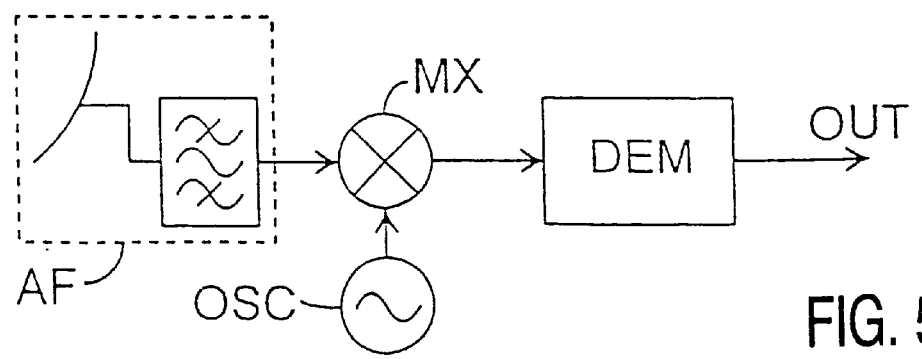
FIG. 5 is a function diagram describing a radio telephony device integrating such a demodulator.

FIG. 5 is a function diagram describing a radio telephony device integrating such a demodulator DEM. This device comprises:

an antenna and filter system AF for receiving a frequency-modulated radio signal, a selection module formed by at least one oscillator OSC and one mixer MX for selecting said radio signal and converting its frequency to an intermediate frequency, a demodulator DEM as described above intended to restore a demodulated audio signal on the basis of the modulated signal.

I claim:

1. A charge pump device comprising:
   an output terminal;
   a current mirror;
   a capacitive element located between said current mirror and said output terminal; and
   a switch which selectively provides a series connection of said current mirror and said capacitive element to said output terminal.

2. The charge pump device of claim 1, wherein said switch provides said series connection in response to an input signal of said charge pump device.

3. The charge pump device of claim 1, wherein said capacitive element is formed by a transistor having a bias terminal receiving a bias signal which is in-phase with a switching signal received by said switch.

4. The charge pump device of claim 1, further comprising another capacitive element formed by a transistor having a bias terminal receiving a bias signal which is out-of-phase with a switching signal received by said switch.

5. The charge pump device of claim 1, wherein said current mirror is connected between said output terminal and a first supply terminal, said charge pump device further comprising:
   another current mirror connected between said output terminal and a second supply terminal;
   another capacitive element located between said another current mirror and said output terminal; and
   another switch which selectively connects in series said another current mirror and said another capacitive element to said output terminal.

6. A phase-locked loop demodulator which outputs a demodulated signal comprising:
   a phase detector which detects a phase difference between two input signals and outputs a control signal;
   a charge pump which receives said control signal and outputs said demodulated signal; and
   an oscillator which receives said demodulated signal and provides one of said two input signals;
   wherein said charge pump comprises:
      an output terminal;
      a current mirror;
      a capacitive element located between said current mirror and said output terminal; and
      a switch which selectively provides a series connection of said current mirror and said capacitive element to said output terminal in response to said control signal.

7. A radio telephone comprising:
   an antenna which receives a radio signal;
   a mixer which changes a frequency of said radio signal to an intermediate frequency and outputs an intermediate frequency signal; and
   a demodulator which demodulates said intermediate frequency signal and outputs a demodulated signal, said demodulator comprising:
      a phase detector which detects a phase difference between two input signals and outputs a control signal;
      a charge pump which receives said control signal and outputs said demodulated signal; and
      an oscillator which receives said demodulated signal and provides one of said two input signals;
      wherein said charge pump comprises:
         an output terminal;
         a current mirror;
         a capacitive element located between said current mirror and said output terminal; and
         a switch which selectively provides a series connection of said current mirror and said capacitive element to said output terminal in response to said control signal.

* * * * *